(12) United States Patent
Herth et al.

(10) Patent No.: US 11,803,687 B1
(45) Date of Patent: Oct. 31, 2023

(54) INTERACTIVE CROSS-SECTION PARAMETERIZED CELL FOR WIRE IN CIRCUIT DESIGN

(71) Applicant: Cadence Design Systems, Inc., San Jose, CA (US)

(72) Inventors: Peter Herth, Feldkirchen (DE); Thomas Burdick, Saint-Germain-en-Laye (FR)

(73) Assignee: Cadence Design Systems, Inc., San Jose, CA (US)

( * ) Notice: Subject to any disclaimer, the term of this patent is extended or adjusted under 35 U.S.C. 154(b) by 172 days.

(21) Appl. No.: 17/573,380

(22) Filed: Jan. 11, 2022

(51) Int. Cl.
*G06F 30/394* (2020.01)
*G06F 30/31* (2020.01)

(52) U.S. Cl.
CPC ............ *G06F 30/394* (2020.01); *G06F 30/31* (2020.01)

(58) Field of Classification Search
CPC ..................................... G06F 30/394
USPC ......................................... 716/139
See application file for complete search history.

(56) References Cited

U.S. PATENT DOCUMENTS

| | | |
|---|---|---|
| 7,698,662 B1 | 4/2010 | Wu et al. |
| 10,460,069 B1 | 10/2019 | Burdick et al. |
| 2009/0007031 A1 | 1/2009 | Ginetti et al. |
| 2013/0298092 A1 | 11/2013 | Ting et al. |
| 2021/0173999 A1* | 6/2021 | Lefferts ................. G06F 30/367 |

OTHER PUBLICATIONS

U.S. Appl. No. 14/984,844, Non Final Office Action dated Feb. 26, 2019, 7 pgs.
U.S. Appl. No. 14/984,844, Notice of Allowance dated Jul. 10, 2019, 6 pgs.
U.S. Appl. No. 14/984,844, Response filed May 28, 2019 to Non Final Office Action dated Feb. 26, 2019, 12 pgs.
U.S. Appl. No. 14/984,844, Response filed Nov. 5, 2018 to Restriction Requirement dated Sep. 5, 2018, 9 pgs.
U.S. Appl. No. 14/984,844, Restriction Requirement dated Sep. 5, 2018, 6 pgs.

* cited by examiner

*Primary Examiner* — Eric D Lee
(74) *Attorney, Agent, or Firm* — Schwegman Lundberg & Woessner, P.A.

(57) ABSTRACT

Various embodiments provide for a cross-section parameterized cell, which can enable a user to visualize and interactively define or modify one or more wire instances and related elements/structure of a circuit design from an elevation view (or a side view).

20 Claims, 11 Drawing Sheets

INTERACTIVE CROSS-SECTION PARAMETERIZED CELL FOR WIRE IN CIRCUIT DESIGN

TECHNICAL FIELD

Embodiments described herein relate to circuit design and, more particularly, to systems, methods, devices, and instructions that provide an interactive cross-section parameterized cell for a set of wire instances (or wires, in a circuit design, which can be used as part of electronic design automation (EDA).

BACKGROUND

Modern electronic design is typically performed with computer-aided design (CAD) tools or electronic design automation (EDA) systems. By an EDA, a user (e.g., circuit designer) can configure the layout and shape of one or more elements, such as wires, within a circuit design, typically through a layout view (or layout editor) provided by the EDA.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
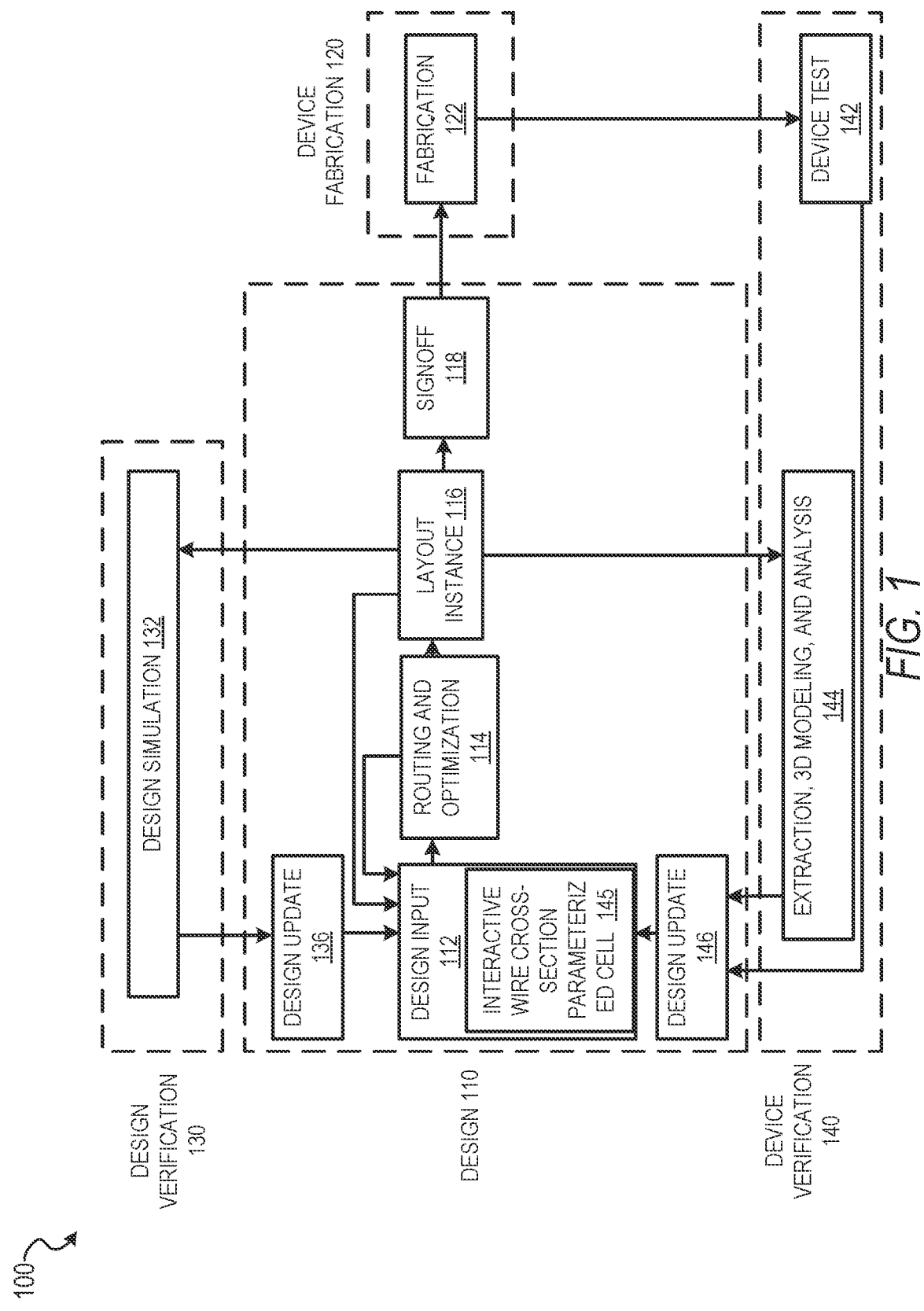
FIG. 1 is a diagram illustrating an example design process flow for an interactive cross-section parameterized cell for a set of wire instances in a circuit design, according to some embodiments.

Generally, a traditional EDA presents a circuit design in a layout view (or plan view) from a top-down (e.g., top-level) or a bottom-up perspective, which permits a user to interactively change a shape of elements of a circuit design (e.g., wire instances and related elements/structures) in a two-dimensional (2D) space presented by the perspective. For instance, some traditional EDAs support a parameterized cell (also known as a PCELL) for a wire (e.g., transmission line) of a circuit design, where the PCELL can be used to configure (e.g., arrange and edit) one or more wire instances (e.g., metal elements implementing wires) and related elements or structures (e.g., shielding,, etc.) within the circuit design according to (e.g., relative to) a center line of the PCELL. For instance, through a graphical user interface presented on a client device, a traditional EDA can display or render a wire (e.g., transmission line) of a circuit design based on information (e.g., one or more parameters) of a parameterized cell of the wire, and display/render the wire by displaying a graphical representation of the center line within 2D space provided by a layout view and a graphical representation of each wire instance (or related element/structure) associated with the wire within the 2D space. By interacting (e.g., moving) with the graphical representation of the center line, a user can edit the shape of the wire within the 2D space, which can in turn can determine arrangement/rearrangement of the one or more wire instances or elements/structures relative to (e.g., along) the edited center line, and can also cause updates to one or more corresponding parameters of the parameterized cell. In this way, the parameterized cell of the wire can be stretched or reshaped easily.

As used herein, a wire can include a transmission line, which comprises one or more wire instances (e.g., metal elements implementing wires) and related elements or structures (e.g., shielding,, etc.) for those one or more wire instances.

Various embodiments provide for a cross-section parameterized cell, which can enable a user to visualize and interactively define or modify one or more wire instances and related elements/structure (e.g., in association with a transmission line) of a circuit design from an elevation view (or a side view). According to some embodiments, a first parameterized cell describes (e.g., represents) one or more wire instances (e.g., metal elements or tracks) in a circuit design, and can describe one or more related elements/structures (e.g., shielding) in the circuit design, and a second parameterized cell (e.g., associated with the first parameterized cell) that describes a cross section of the one or more wire instances or the one or more related elements/structures, where the second parameterized cell represents a cross-section parameterized cell described herein. By the second parameterized cell (which is separate from the first parameterized cell), a user can view or modify (e.g., one or more interactive edits) the cross section (the one or more wire instances or the one or more related elements/structures), from an elevation perspective (or view), through a graphical user interface (GUI) of an EDA. For instance, a user can modify the second. parameterized cell by interacting with (e.g., moving, stretching, etc.) a graphical representation of the second parameterized cell presented through the GUI, where a user interaction can translate to an adjustment to (e.g., can cause updates) one or more parameters of the second parameterized cell.

With respect to modifying/editing the second parameterized cell, dragging a shape from a layer stack view (displaying available physical elements according to the layer stack of the circuit design) into an elevation view displaying the cross section based on the second parameterized cell, which can create (e.g., generate) a new wire instance (e.g., new metal track in association with the transmission line) at a position and with a layer (of the circuit design) associated with the dragged shape. Stretching a graphical shape displayed in the elevation view (displaying the cross section) in horizontal direction (e.g., along an x-axis) can modify the position or the width of a physical element of the graphical shape. Stretching graphical shapes displayed in the elevation view (displaying the cross section) in vertical direction (e.g., along a y-axis) can cause creation of a via between overlapping graphical shapes.

For some embodiments, the second parameterized cell comprises a set of parameters, and one or more of those parameters can encode graphical shapes representing the cross section and can be updated based on direct manipulation (e.g., fluid edits) of those graphical shapes (e.g., via a client user interface). Such parameters can be regarded herein as fluid parameters. Additionally, for some embodiments, an adjustment to one or more parameters of the second parameterized cell cause an adjustment (e.g., an update) to the cross-section information (e.g., one or more parameters) of the first parameterized cell. For example, the first parameterized cell can be coupled to the second parameterized cell such that one or more updates to information in the second parameterized cell are communicated to the cross-section information of the first parameterized cell (e.g., in real time), and vice versa. In doing so, one or more parameters of the first parameterized cell can be updated with the description corresponding to the edited state of the second parameterized cell. For some embodiments, an update to a parameter of the first parameterized cell (e.g., caused by a user modification/edit to the second parameterized cell) can cause a redrawing (e.g., re-rendering) of at least some portion of one or more graphical representations based on the first parameterized cell. Likewise, for some embodiments, an update to a parameter of the second parameterized cell (e.g., caused by a user modification edit to the first parameterized cell) can cause a redrawing (e.g., re-rendering) of at least some portion of one or more graphical representations based on the second parameterized cell.

The data (e.g., values of one or more parameters) of the second parameterized cell can be populated based on (e.g., seeded by) cross-section information provided by the first parameterized cell. In this way, the underlying data representation of the second parameterized cell uses the same cross-section specification as used by the first parameterized cell. The cross-section information of the first parameterized cell can include, for example, position (e.g., layer position, relative position, or edge position), space, height, width, number of metal elements/tracks, or the like with respect to the one or more wire instances or the one or more related elements/structures (e.g., associated with the transmission line), For instance, the cross-section information can be provided by one or more component description format (CDF) parameters of the first parameterized cell. For some embodiments, the first parameterized cell comprises a transmission line parameterized cell.

By use of various embodiments described herein, a cross section of one or more wire instances (or related elements/structures), which cannot be easily visualized or modified by the first parameterized cell (e.g., transmission line parameterized cell alone), to be visualized (at an elevation perspective) or modified using a second parameterized cell having one or more parameters based on cross-section information from the first parameterized cell.

As used herein, a parameterized cell of a circuit design can represent a part or a component of the circuit design that is generated by an EDA based on one or more parameters associated with the parameterized cell, where the one or more parameters determine or define the structure the part or the component. A value of a parameter of the parameterized cell can describes an attribute or characteristic of the part or the component. For example, a transmission line parameterized cell can be a fluid parameterized cell, which allows a user to interactively modifying/editing of a shape of the transmission line (and its associated wires and wire elements/structures) by modifying/editing of the transmission line's center line via a fluid path (through a graphical user interface). While a cell in a circuit design can represent a basic unit of functionality within the circuit design, and a parameterized cell can allow flexible representation of a cell by the one or more parameters of the parameterized cell. A parameterized cell with selected parameter values can be used as part of a circuit design. An instance of a parameterized cell with selected parameter values can allow creation of the structure for the associated component within a larger circuit design. Accordingly, a parameterized cell can simplify design process by standardizing certain portions of a circuit and using input values to generate shapes of a part or a component (e.g., one or more wire instances and related elements/structures) for a portion of the circuit associated with the parameterized cell. The parameterized cell can be implemented (e.g., within circuit design data) by a data structure within data describing a circuit design. As used herein, a fluid parameter of a parameterized cell can include a parameter for which an adjustment is limited to a user edit to a graphical representation of the parameterized cell through a graphical user interface.

Although various embodiments are described herein with respect to parameterized cells for a set of wire instances (or a transmission line for one or more wire instances and related elements/structures), some embodiments can be implemented with respect to one or more parameterized cells of other types of circuit parts, components, or elements, such as metal fill parameterized cell.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for an interactive cross-section parameterized cell for a set of wire instances in a circuit design, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. Though not shown, the routing and optimization 114 operation can include a clock tree synthesis (CTS) operation, which can generate one or more clock trees that deliver clock signal from clock sources of a circuit design to a plurality of clock tree leaf nodes comprising clock tree pins (e.g., of circuit devices, such as flip-flops) within the circuit design. The routing and optimization 114 operation may also include other operations not shown, such as those relating to floorplanning, placement, post-placement optimization, and post-routing optimization.

While the design process flow 100 shows optimization occurring prior to a layout instance 116, timing analysis, and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

Design inputs are used in the design input 112 operation to generate an initial circuit layout. The design inputs may be further processed during the design input 112 operation via a process, such as logic-synthesis to generate a circuit netlist mapped to a target standard library manufacturable by the foundry in fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

As shown, the design input 112 operation can comprise an interactive wire cross-section parameterized cell 145 operation, where a cross-section parameterized cell of an embodiment can be generated (e.g., based on information from a transmission line parameterized cell) or used to visualize or interactively modify/edit a wire instance (e.g., associated with the transmission line) from a cross section, elevation perspective as described herein.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed. Though not illustrated, the timing analysis and the routing and optimization 114 operation can comprise the interactive wire cross-section parameterized cell 145 operation, and operation of generating the initial layout instance 116 can comprise the interactive wire cross-section parameterized cell 145 operation.

Figure 2:
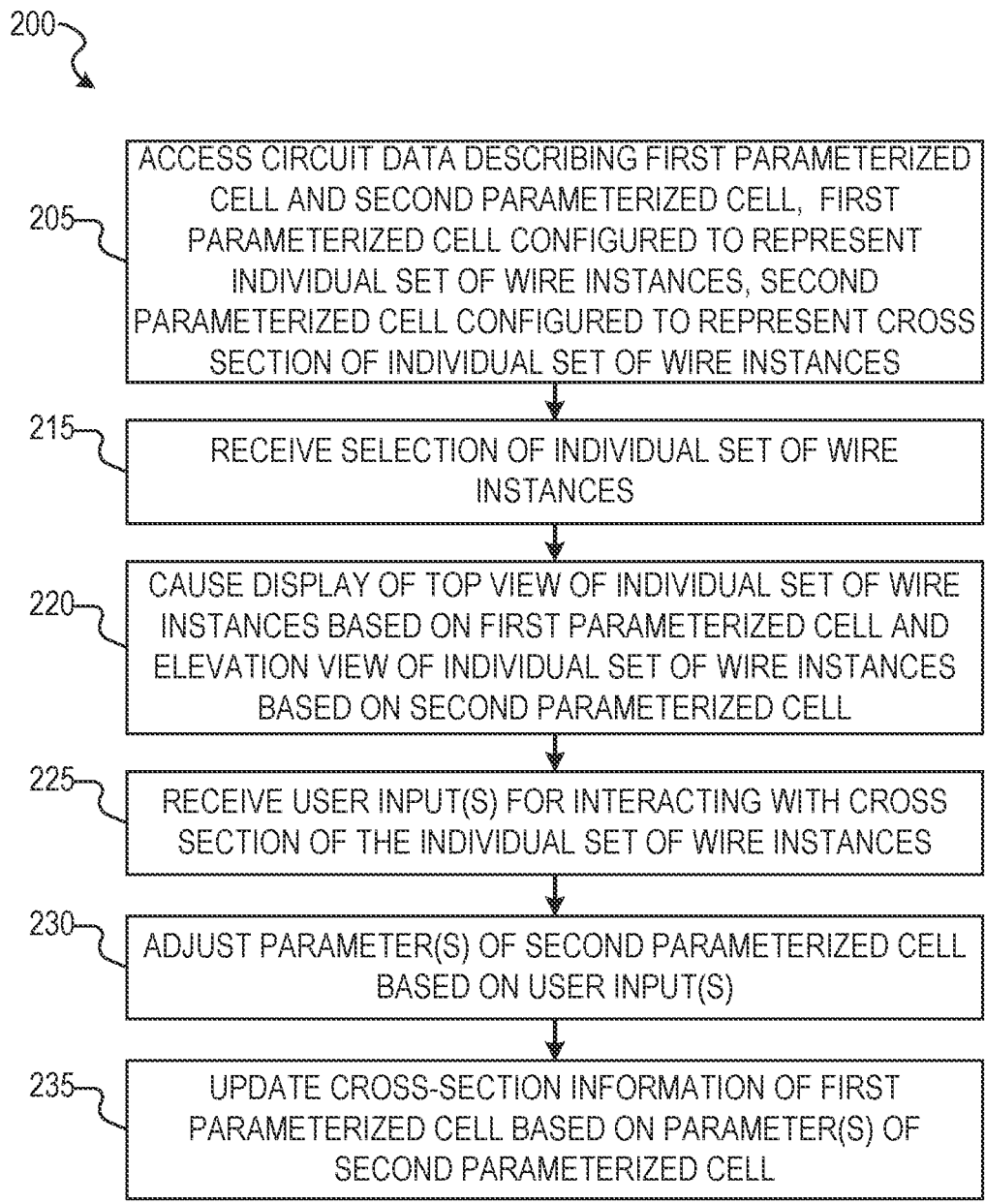
FIGS. 2 and 3 are flowcharts illustrating example methods for an interactive cross-section parameterized cell for a set of wire instances in a circuit design, according to some embodiments.
Figure 3:
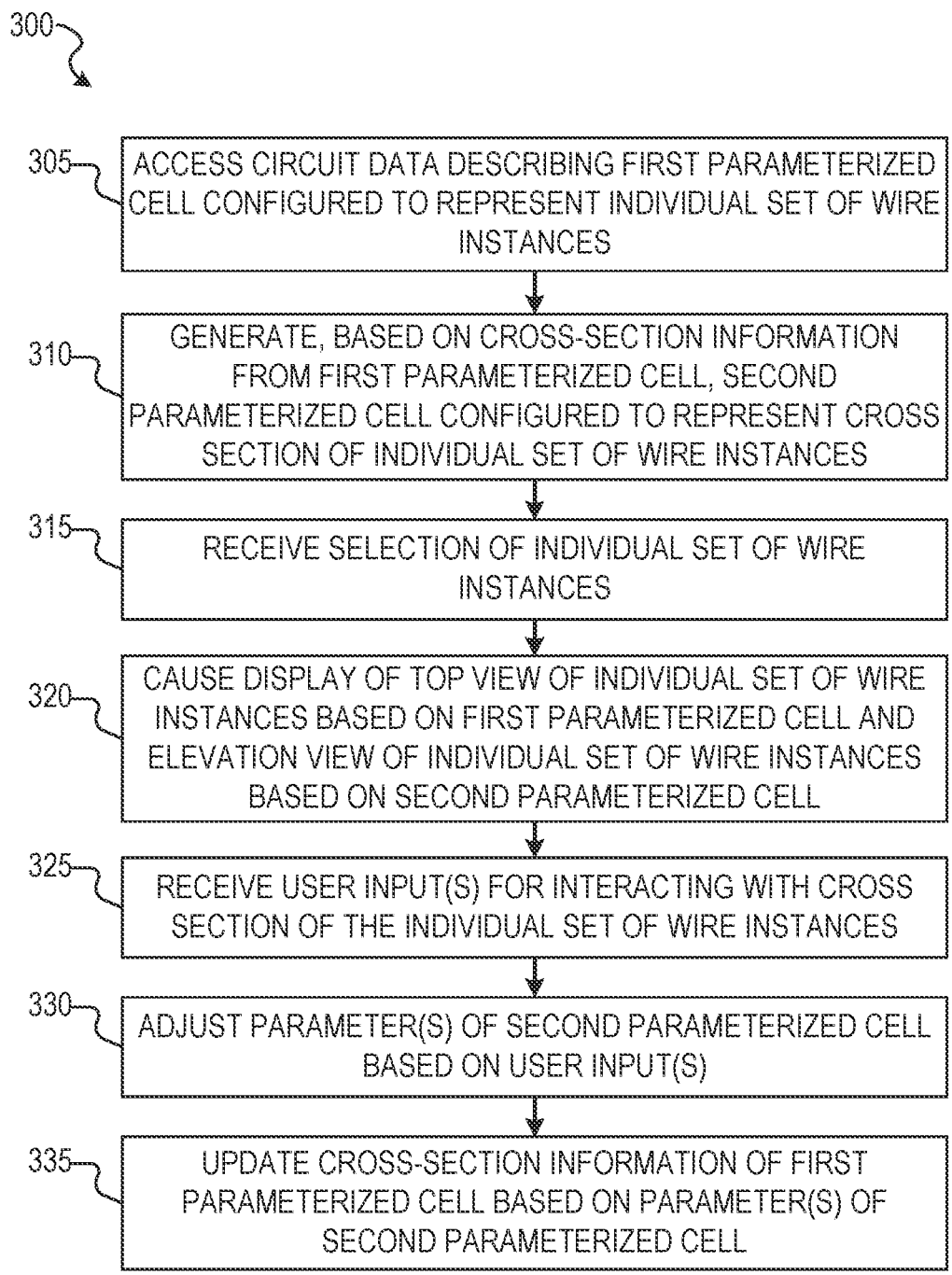

FIGS. 2 and 3 are flowcharts illustrating example methods for an interactive cross-section parameterized cell for a set of wire instances in a circuit design, according to some embodiments. According to some embodiments, the cross-section parameterized cell is a cross-section parameterized cell for a transmission line, which comprises one or more wire instances and related elements or structures (e.g., shielding) and which can comprise one or more related elements/structures. It will be understood that example methods described herein may be performed by a device, such as a computing device executing instructions of an EDA software system, in accordance with sonic embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates the example method 200 for an interactive cross-section parameterized cell for a set of wire instances in a circuit design, according to some embodiments. The method 200 can be performed, for example, as part of displaying a circuit design in a layout view presented by an EDA software system, and can facilitate a modification/edit of the circuit design through the layout view. An operation of the method 200 (or another method described herein) may be performed by a hardware processor (e.g., central processing unit or graphics processing unit) of a computing device (e.g., desktop, server, etc.).

As illustrated, at operation 205 circuit data is accessed, where the circuit data can describe sets of wire instances of a circuit design, and where the circuit data describes a first parameterized cell and a second parameterized cell for an individual set of wire instances. For some embodiments, the first parameterized cell is configured to represent the individual set of wire instances, and the second parameterized cell is configured to represent a cross-section of the individual set of wire instances, where the second parameterized cell is (e.g., is generated) based on cross-section information (e.g., layer position, relative position, edge position, space, height, width, or number of metal elements/tracks) provided by the first parameterized cell. The second parameterized cell can represent a cross-section parameterized cell, which can enable one or more cross section visualization and modification features of various embodiments described herein. For some embodiments, the first parameterized cell is a transmission line parameterized cell (which represents the transmission line), and the second parameterized cell is associated with the same transmission line.

For operation 215, a user selection of the individual set of wire instances from the sets of wire instances (described by the circuit data accessed by operation 205) through a graphical user interface (GUI), which can he presented on a client device (e.g., by an EDA software system). At operation 220, a top view of the individual set of wire instances and an elevation view of the individual set of wire instances are caused to be displayed on the graphical user interface. For some embodiments, the top view includes a first graphical representation of the individual set of wire instances (which can provide a top-down perspective), and the elevation view includes a second graphical representation of a cross section of the individual set of wire instances (at an elevation or side perspective), where the first graphical representation is generated based on (e.g., one or more parameters of) the first parameterized cell, and where the second graphical representation is generated based on (e.g., one or more parameters of) the second parameterized cell. The elevation view can comprise a graphical indication of a center line of the cross section of the individual set of wire instances, which can be useful to a user when visualizing or modifying a physical element of the set of wire instances with respect to the cross section.

At operation 225, a set of user inputs is received through the graphical user interface, where the set of user inputs is for interacting (e.g., modifying or editing) with the cross section of the individual set of wire instances. For example, the graphical user interface comprises a layer stack view, where the layer stack view includes a third graphical representation of a set of physical elements (e.g., arrangement of physical elements) available on different layers of the circuit design. The set of user inputs can comprise dragging a graphical shape from the layer stack view to the second graphical representation of the cross section to add a new physical element to the individual set of wire instances (e.g., at a particular layer position, edge position, and center line-relative position within the cross section).

In another example, where the second graphical representation of the cross section comprises a set of graphical shapes (e.g., fluid shapes) that each represent a different physical element (e.g., metal element, shielding, etc.) of the individual set of wire instances, and the set of user inputs can comprise stretching a graphical shape in the second graphical representation of the cross section. For some embodiments, the stretching of the graphical shape causes a modification of at least one of a position or width of an individual physical element of the individual set of wire instances represented by the graphical shape. For instance, the stretching can comprise stretching the graphical shape along a horizontal axis (e.g., x-axis) within the elevation view). Such a stretching (along the horizontal axis) can cause a modification of a position or a width of a physical element of the individual set of wire instances corresponding to the graphical shape. In another instance, the stretching can comprise stretching the graphical shape along a vertical axis (e.g., y-axis) within the elevation view. Such a stretching (along the vertical axis) can cause creation of a via between overlapping graphical shapes of the set of graphical shapes that results from the stretching.

A set of parameters of the second parameterized cell is adjusted, at operation 230, based on the set of user inputs. After operation 230, at operation 235 the cross-section information of the first parameterized cell is updated based on the set of parameters of the second parameterized cell. In doing so, one or more changes (e.g., modifications) implemented with respect to the second parameterized cell can be communicated to one or more corresponding portions (e.g., one or more corresponding parameters) of the first parameterized cell. This updating (e.g., communication) can be made in real time. Likewise, one or more changes (e.g., modifications) implemented with respect to cross section information of the first parameterized cell can be communicated to one or more corresponding portions (e.g., one or more corresponding parameters) of the second parameterized cell. This updating (e.g., communication) can be made in real time. For some embodiments, the cross-section information of the first parameterized cell comprises a top view parameter modifiable by a field, the set of parameters of the second parameterized cell includes a fluid parameter modifiable by a graphical user interface, and the updating of the cross-section information comprises translating the fluid parameter to the top view parameter. For some embodiments, the fluid parameter of the second parameterized cell is a parameter that is not adjustable by way of the top view, but is adjustable by way of the elevation view.

Referring now to FIG. 3, the flowchart illustrates the example method 300 for an interactive cross-section parameterized cell for a set of wire instances in a circuit design, according to some embodiments. In particular, the method 300 illustrates variation the method 200 described above with respect to FIG. 2, where a cross-section parameterized cell is generated. Like the method 200 of FIG. 2, the method 300 can be performed as part of displaying a circuit design in a layout view presented by an EDA software system, and can facilitate a modification/edit of the circuit design through the layout view. An operation of the method 300 may be performed by a hardware processor.

As illustrated, at operation 305 circuit data is accessed, where the circuit data describes a first parameterized cell for an individual set of wire instances, and where the first parameterized cell is configured to represent the individual set of wire instances. Based on the cross-section information from the first parameterized cell, at operation 310 a second parameterized cell for the individual set of wire instances, where the second parameterized cell is configured to represent a cross-section of the individual set of wire instances. For some embodiments, the cross-section information comprises a top view parameter modifiable by a field, where the set of parameters includes a fluid parameter is modifiable by the graphical user interface, and wherein the generating of the second parameterized cell comprises translating the top view parameter to the fluid parameter, where the fluid parameter is not adjustable by the top view. For various embodiments, operations 315, 320, 325, 330, 335 are respectively similar to operations 215, 220, 225, 230, 235 of the method 200 described with respect to FIG. 2.

Figure 4:
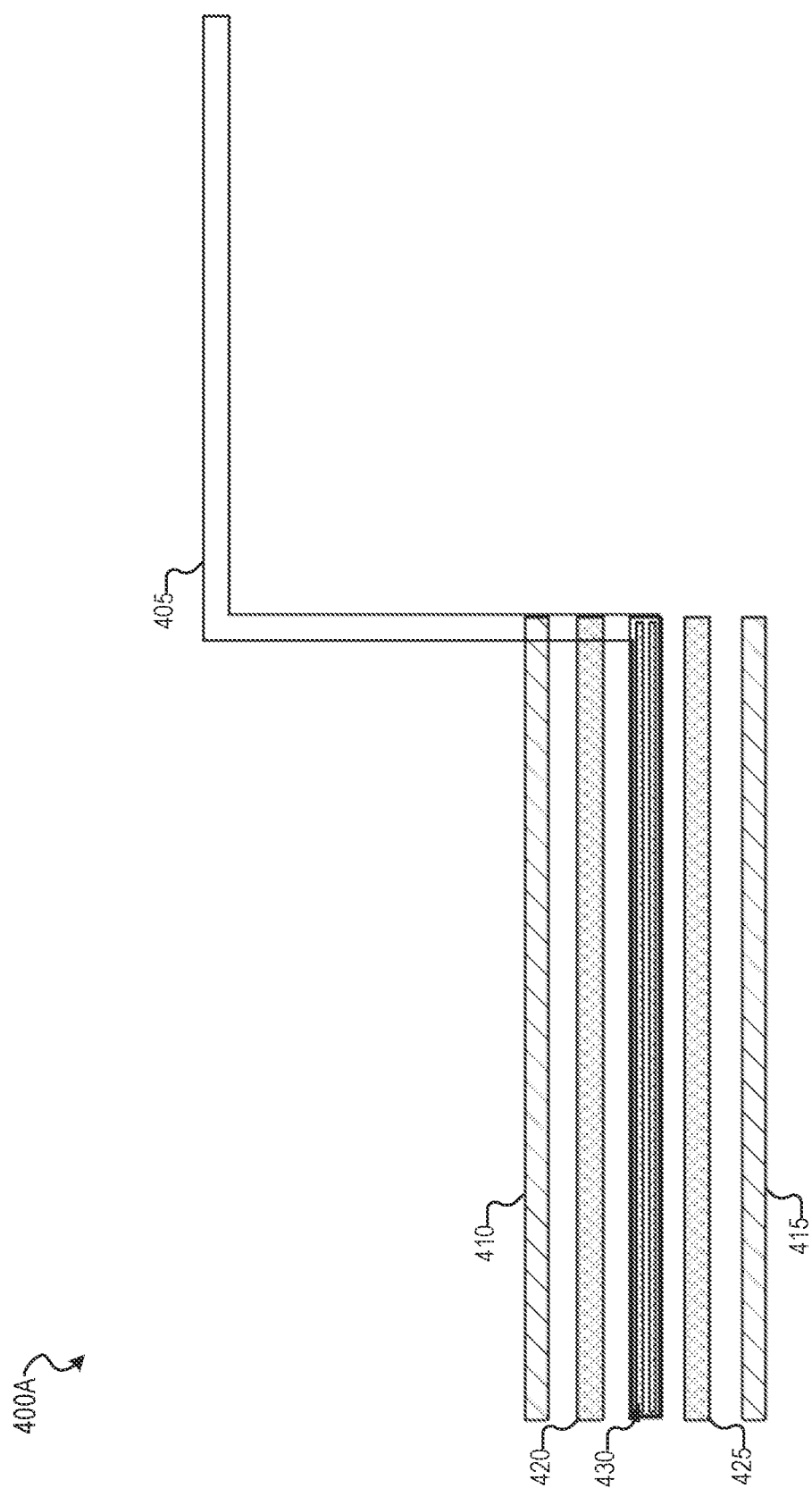
FIGS. 4 and 5 illustrate an example top view of a transmission line described by a transmission line parameterized cell used by some embodiments.
Figure 5:
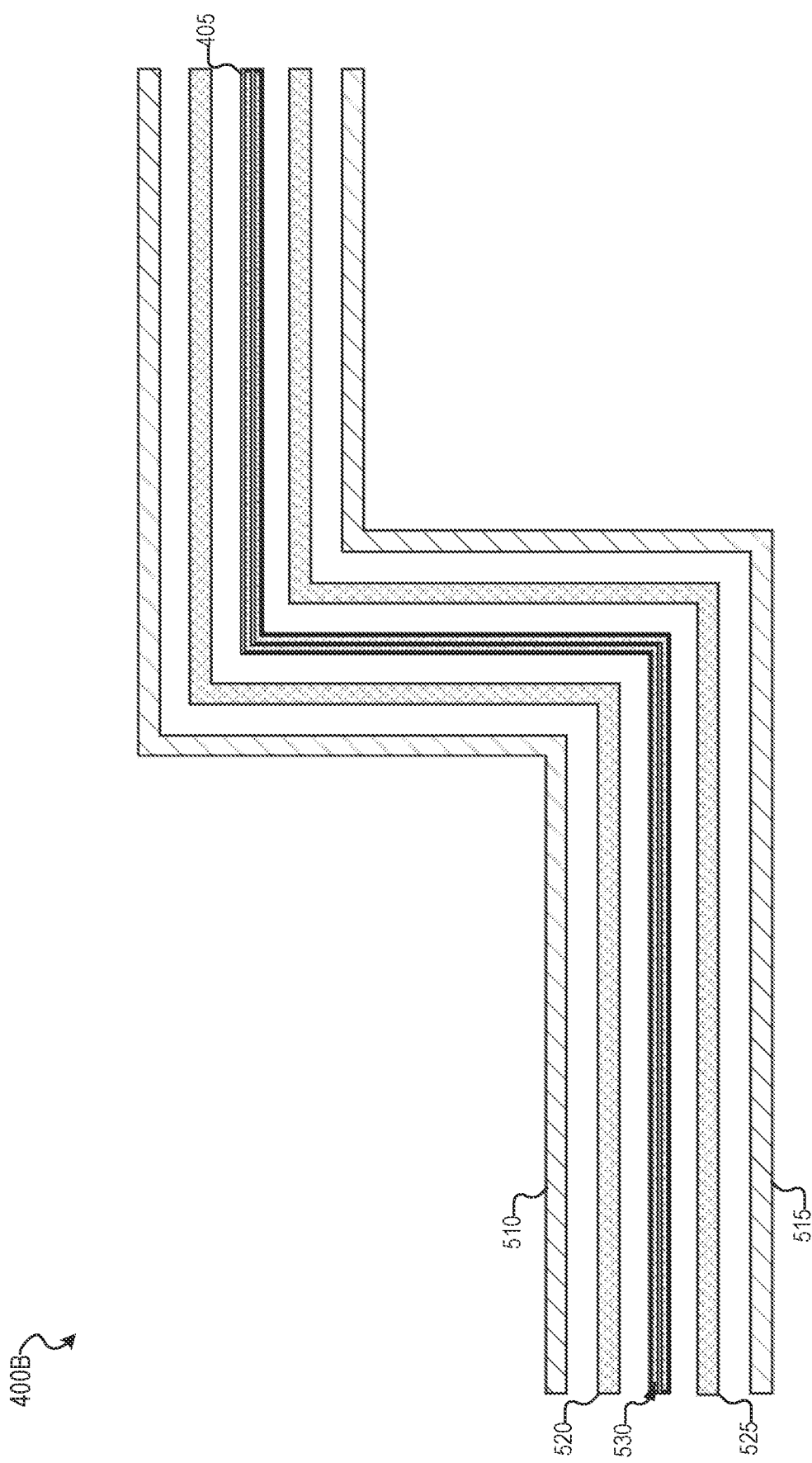

FIGS. 4 and 5 illustrate an example top view 400A, 400B of a transmission line described by a transmission line parameterized cell used by some embodiments. The top view 400A, 400B provides a top-down perspective of wire instances and related elements/structures of the transmission line described by the transmission line parameterized cell. In particular, FIG. 4 illustrates the top view 400A before reshaping of a transmission line, and FIG. 5 illustrates the top view 400B after reshaping of a transmission line.

Referring now to FIG. 4, the top view 400A presents, in connection with the transmission line, shielding elements 410 and 415, and wire instances (e.g., metal elements) 420, 425, and 430. The top view 400A also presents a center line 405 of the transmission line. According to various embodiments, the shielding elements 410, 415 and the wire instances 420, 425, 430 are arranged in a circuit design according to (e.g., relative to or along) the center line 405. One or more parameters of the transmission line parameterized cell can define a current arrangement (e.g., configuration, orientation, positioning, etc.) of the shielding elements 410, 415 and the wire instances 420, 425, 430 within the circuit design. As shown in FIG. 4, a user has edited (e.g., modified, shaped, stretched, or moved through a graphical user interface presenting the top view 400A) the center line 405 from its original position.

Referring now to FIG. 5, as a result of the editing of the center line 405, various physical elements associated with the transmission line are rearranged (e.g., remodified, reconfigured, reoriented, repositioned, etc.) based on the edited center line 405, as shown by the top view 400B, For example, as shown in FIG. 5, the center line 405 as edited causes the shielding elements 410 and 415 to be rearranged (e.g., reshaped) to shielding elements 510 and 515, and causes the wire instances 420, 425, 430 to be rearranged to wire instances 520, 525, 530. By fluid editing of the center line 405 of the transmission line, the path of the transmission line (and its related physical elements) can be edited within the circuit design.

FIGS. 6 through 9 illustrate example elevation views 610, 710, 910 of a transmission line described by a cross-section parameterized cell, according to some embodiments. In particular, FIGS. 6 through 9 illustrate example layout views 600, 700A, 700B, 900 that respectively include example top views 605, 705, 905, that respectively include elevation views 610, 710, 910, and that respectively include example layer stack views 615, 715, 915. For some embodiments, an illustrated elevation view is respectively displayed in response a user invoking the elevation view option through a top view.

Figure 6:
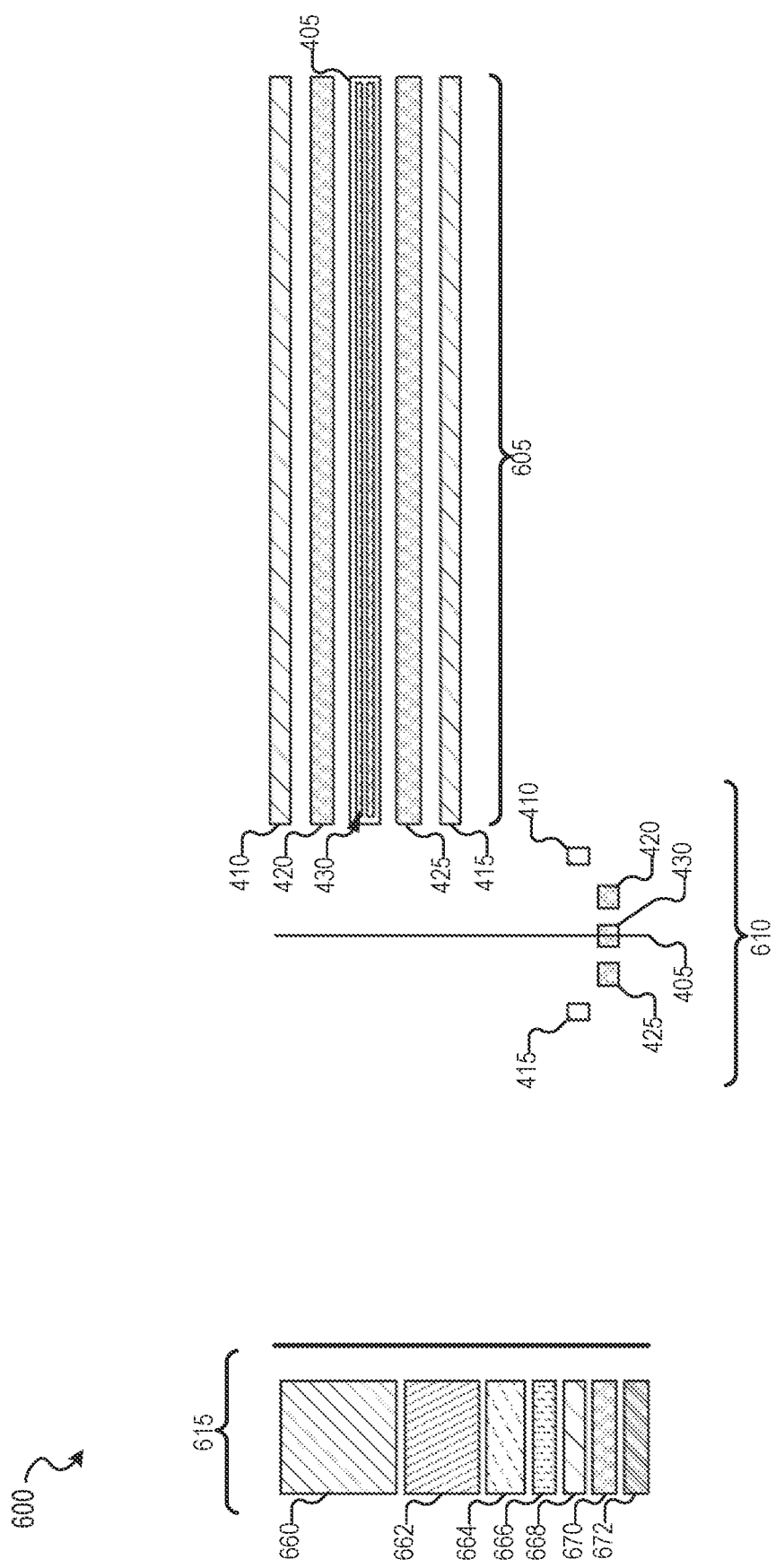
FIGS. 6 through 9 illustrate example elevation views of a transmission line described by a cross-section parameterized cell, according to some embodiments.

Referring now to FIG. 6, the layout view 600 represents an example with respect to the physical elements and the transmission line of FIG. 4. In particular, as shown the top view 605 represents the top view 400A of FIG. 4. Additionally, the elevation view 610 presents the center line 405 and a cross section of the shielding elements 410, 415 and the wire instances 420, 425, 430. The layer stack view 615 presents graphical shapes 660, 662, 664, 666, 668, 670, 672 that represent various physical elements that are associated with, and available for use on (e.g., to be added to), corresponding layers of the circuit design. One or more of the physical elements represented by graphical shapes 660, 662, 664, 666, 668, 670, 672 can represent different types of physical elements that can be added with respect to a transmission line, such as metal tracks (e.g., tracks on different metal layers (e.g., M1, M2, M3, M4, etc.) of the circuit design) or shielding elements. For instance, graphical shape 660 can facilitate an addition of a new physical element, of the physical element type represented by the graphical shape 660, on a top-most layer of the circuit design, while graphical shape 672 can facilitate an addition of a new physical element, of the physical element type represented by the graphical shape 672, on a bottom-most layer of the circuit design. To add each of the wire instances 420, 425, 430 with respect to the transmission line, a user can drag the graphical shape 670 over to the cross section, presented by the elevation view 610, for each of the wire instances, thereby adding each of the wire instances 420, 425, 430 to the second-to-last layer of the circuit design. Once the wire instances 420, 425, 430 are added, a user can reposition one or more of the wire instances 420, 425, 430, in the cross section, along the corresponding layer of the circuit design. Additionally, once the wire instances 420, 425, 430 are added, a user can change the width of one or more of the wire instances 420, 425, 430 along the corresponding layer of the circuit design (e.g., by stretching a graphical shape representing the wire instance 420 along the horizontal axis). According to some embodiments, the height of physical elements in the cross section are set based on the configuration of the circuit design and its layers. In a manner similar to the graphical shape 670 and the wire instances 420, 425, 430, each of the shielding elements 410, 415 can be added via the graphical shape 668.

Figure 7:
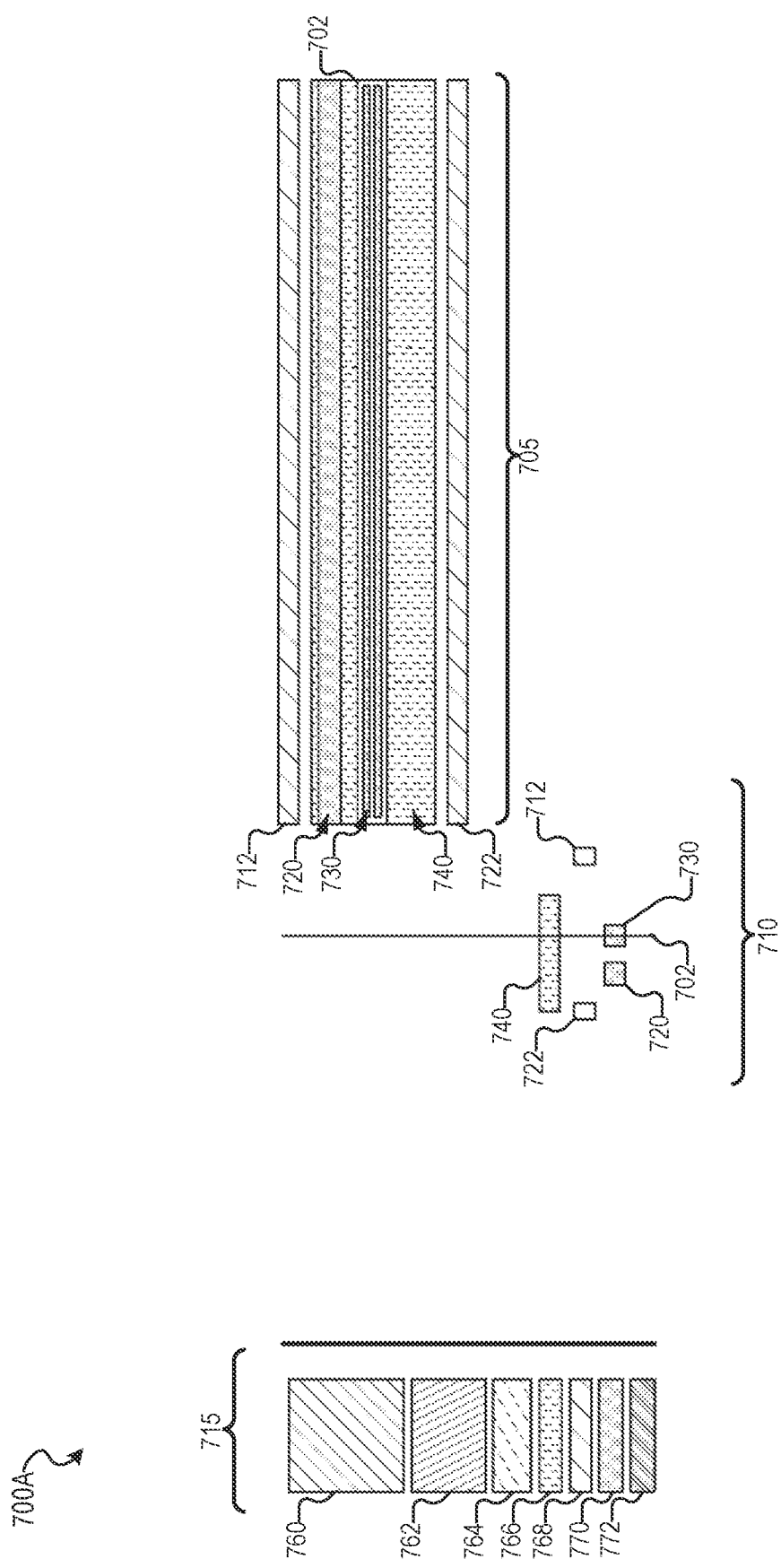

Referring now to FIG. 7, similar to FIG. 6, the layout view 700A, 700B includes the top view 705, the elevation view 710, and the layer stack view 715, where the top view 705 displays a transmission line described by a transmission line parameterized cell, and the elevation view 710 displays a cross section of the transmission line as described by a cross-section parameterized cell. As shown, the transmission line has a center line 702, has shielding elements 712, 722, metal instances 720, 730 on a first metal layer (e.g., M1) of the circuit design, and a wire instance 740 on a second metal layer (e.g., M2) of the circuit design. The layer stack view 715 is similar to the layer stack view 615 illustrated in FIG. 6, where graphical shapes 760, 762, 764, 766, 768, 770, 772 are respectively similar (in purpose and use) to the graphical shapes 660, 662, 664, 666, 668, 670, 672 of the layer stack view 615.

Though not illustrated, the wire instance 720 can cause a creation of a via between the wire instance 740 and the wire instance 720 by stretching the top edge of the graphical shape representing the wire instance 702 horizontally until the corresponding graphical shape overlaps with the graphical shape of the wire instance 740. Depending on the embodiment, one or more of the layout views 600, 700A, 700B, 900 (of FIGS. 6, 7, 8, 9) can provide a mechanism that enables a user to interactively copy and distribute graphical shapes easily, which can facilitate the additional of multiple metal tracks with respect to a transmission line. Additionally, one or more of the layout views 600, 700A, 700B, 900 (of FIGS. 6, 7, 8, 9) can provide a mechanism that enables a user to modify or update multiple transmission lines to the same cross section.

Figure 8:
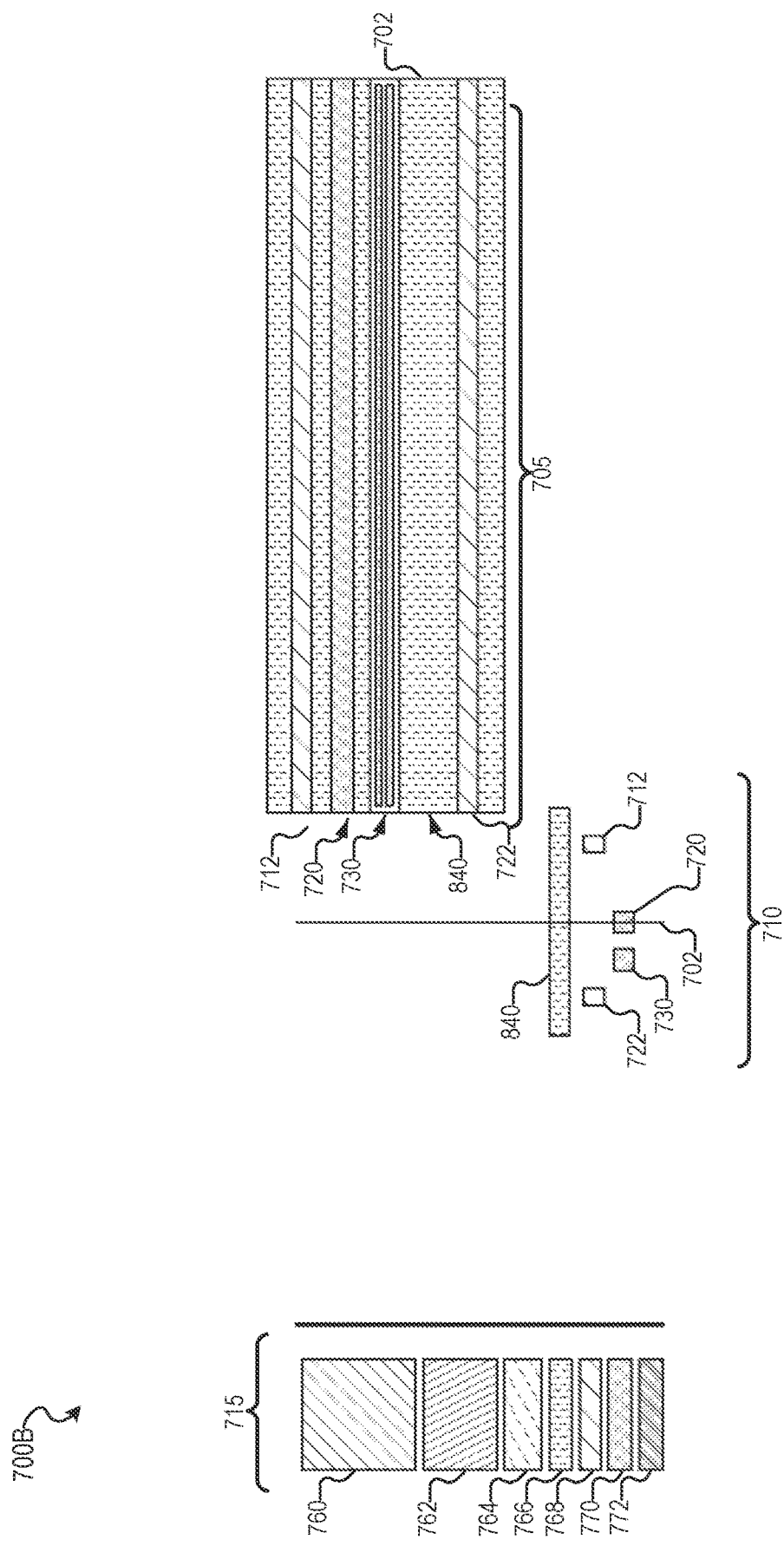

Referring now to FIG. 8, the layout view 700B illustrates the result of a user horizontally stretching the wire instance 740 outward (along the horizontal axis of the second metal layer) in the cross section presented in the elevation view 710 of the layout view 700A. According to some embodiments, this stretching results in an increased width for the wire instance 740, represented by the wire instance 840 in the layout view 700B.

Figure 9:
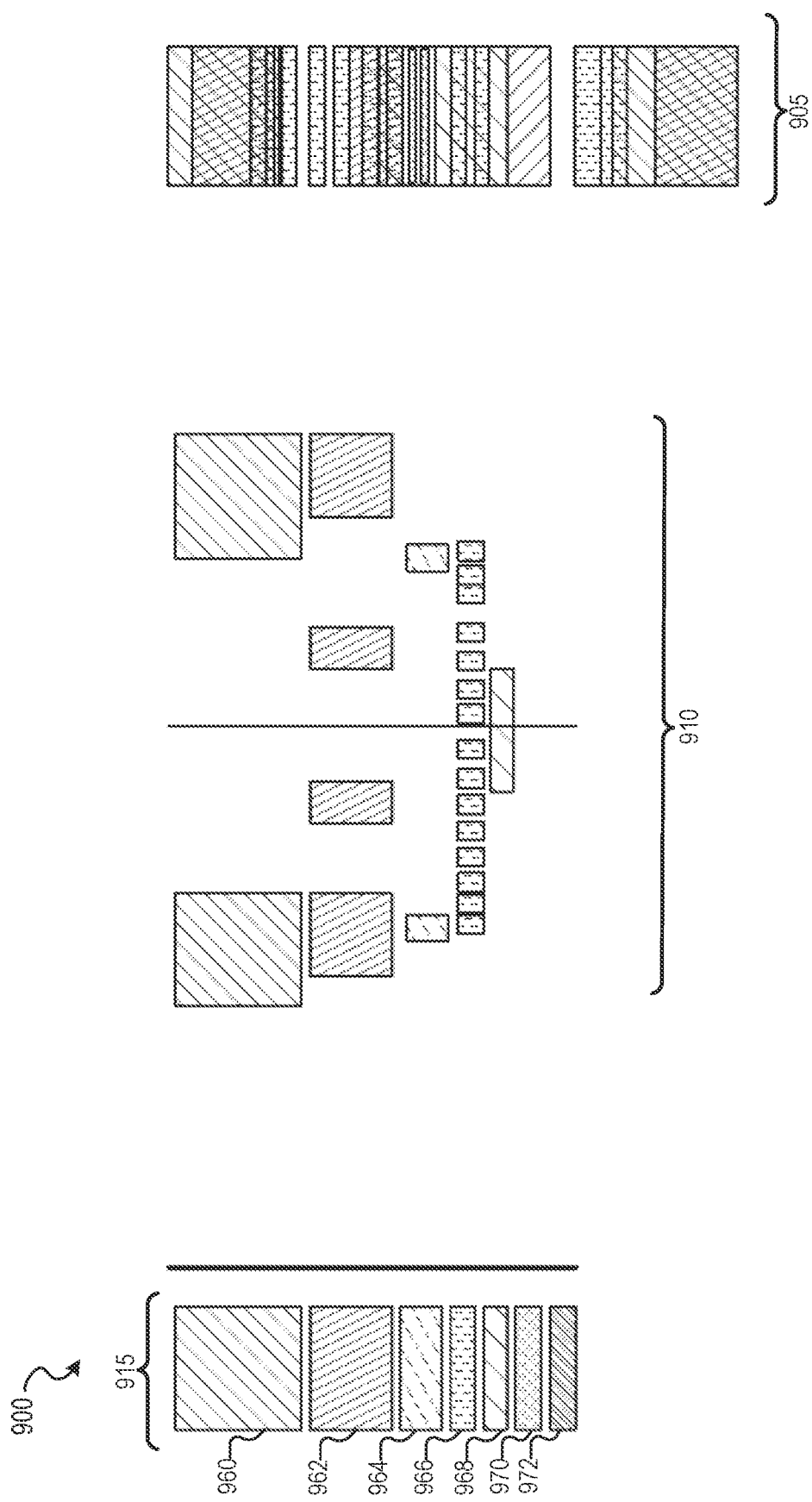

Referring now to FIG. 9, similar to FIG. 6, the layout view 900 includes the top view 905, the elevation view 910, and the layer stack view 915, where the top view 905 displays a transmission line described by a transmission line parameterized cell, and the elevation view 910 displays a cross section of the transmission line as described by a cross-section parameterized cell. The layout view 900 illustrates a complicated example of a transmission line with several physical elements that can be modified (e.g., repositioned, width adjustment, etc.) through the elevation view 910. The layer stack view 915 is similar to the layer stack view 615 illustrated in FIG. 6, where graphical shapes 960, 962, 964, 966, 968, 970, 972 are respectively, similar (in purpose and use) to the graphical shapes 660, 662, 664, 666, 668, 670, 672 of the layer stack view 615.

Figure 10:
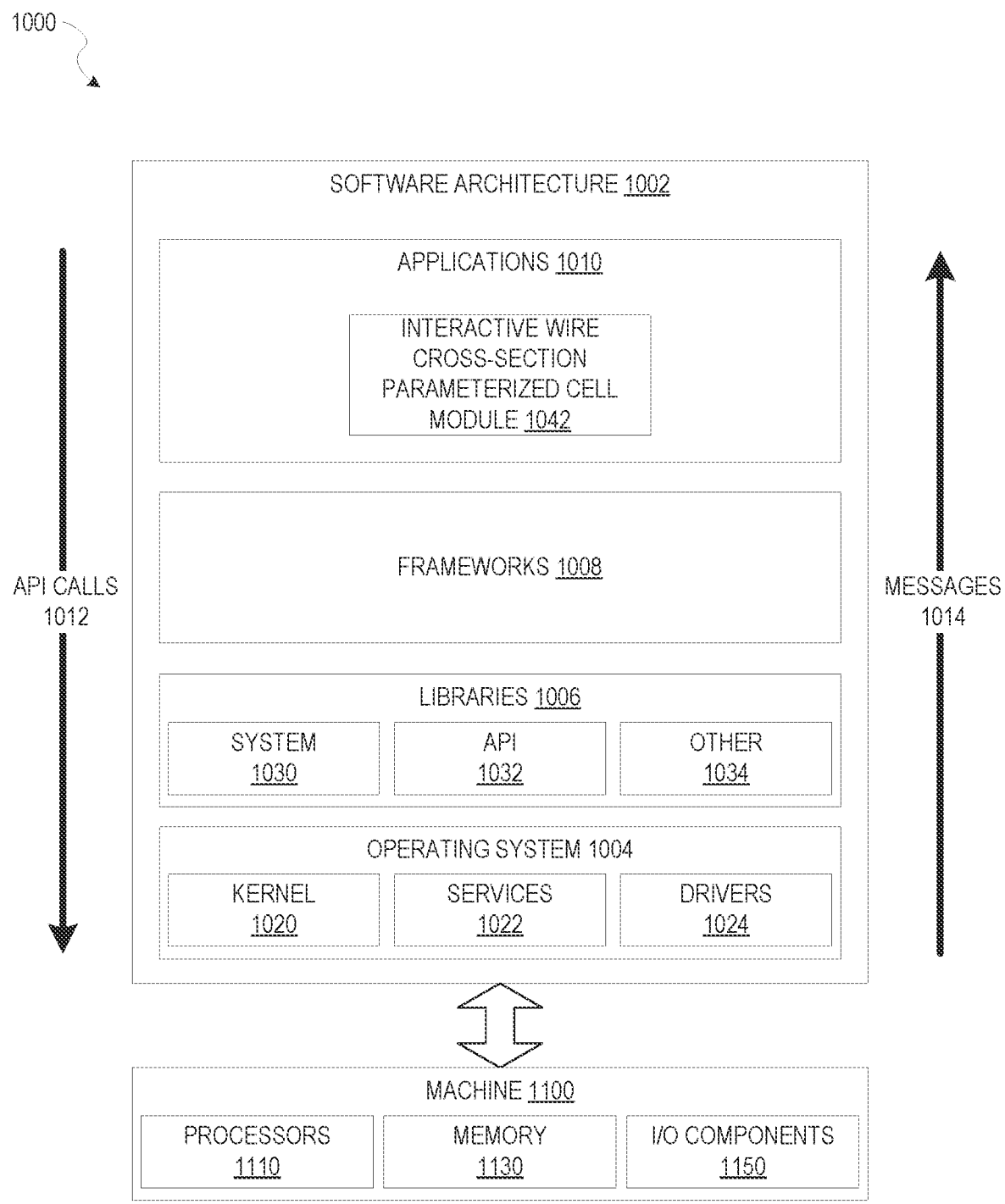
FIG. 10 is a block diagram illustrating an example of a software architecture that may be operating on an EDA computer and may be used with methods for an interactive cross-section parameterized cell for a set of wire instances in a circuit design, according to some embodiments.

FIG. 10 is a block diagram 1000 illustrating an example of a software architecture 1002 that may be operating on an EDA computer and may be used with methods for an interactive cross-section parameterized cell for a set of wire instances in a circuit design, according to some embodiments. The software architecture 1002 can be used as an EDA computing device to implement any of the methods described above. Aspects of the software architecture 1002 may, in various embodiments, be used to store circuit designs, and to facilitate generation of a circuit design in an EDA environment, from which physical devices may be generated.

FIG. 10 is merely a non-limiting example of a software architecture 1002, and it will be appreciated that many other architectures can be implemented to facilitate the functionality described herein. In various embodiments, the software architecture 1002 is implemented by hardware such as a machine 1100 of FIG. 11 that includes processors 1110, memory 1130, and I/O components 1150. In this example, the software architecture 1002 can be conceptualized as a stack of layers where each layer may provide a particular functionality. For example, the software architecture 1002 includes layers such as an operating system 1004, libraries 1006, software frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, any server computer of a server system, or any other device described herein may operate using elements of the software architecture 1002. An EDA computing device described herein may additionally be implemented using aspects of the software architecture 1002, with the software architecture 1002 adapted for performing an operation with respect to an interactive cross-section parameterized cell in a manner described herein.

In some embodiments, an EDA application of the applications 1010 supports an interactive cross-section parameterized cell according to embodiments described herein using various modules within the software architecture 1002. For example, in some embodiments, an EDA computing device similar to the machine 1100 includes the memory 1130 and the one or more processors 1110. The processors 1110 also implement a circuit design layout module 1042 for an interactive cross-section parameterized cell for a set of wire instances in a circuit design, in accordance with various embodiments described herein.

In various other embodiments, rather than being implemented as modules of the one or more applications 1010, the circuit design layout module 1042 may be implemented using elements of the libraries 1006, the operating system 1004, or the software frameworks 1008.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionality. The services 1022 can provide other common services for the other software layers. The drivers 1024 are responsible for controlling or interfacing with the underlying hardware, according to some embodiments. For instance, the drivers 1024 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1006 provide a low-level common infrastructure utilized by the applications 1010. The libraries 1006 can include system libraries 1030 such as libraries of blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement an interactive cross-section parameterized cell as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1100 including processors 1110), with these operations being accessible via a network (e.g., the Internet) and via one or more appropriate interfaces (e.g., an API), In certain embodiments, for example, a client device may relay or operate in communication with cloud computing systems, and may access circuit design information in a cloud environment.

The performance of certain of the operations may be distributed among the processors, not only residing within a single machine 1100, but deployed across a number of machines 1100. In some embodiments, the processors 1110 or processor-implemented modules are located in a single geographic location (e.g., within a home environment, an office environment, or a server farm). In some other embodiments, the processors or processor-implemented modules are distributed across a number of geographic locations.

Figure 11:
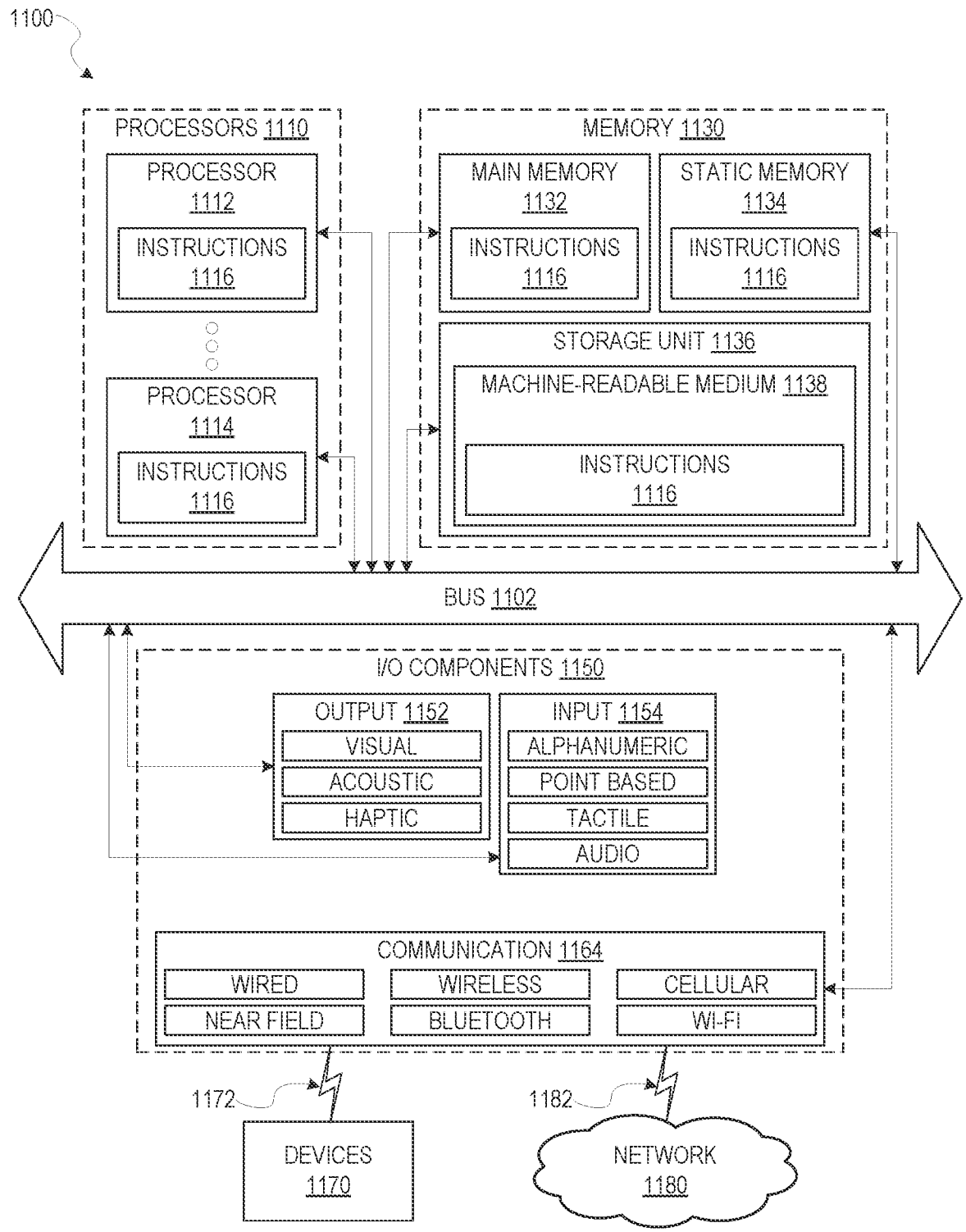
FIG. 11 is a diagram representing a machine in the form of a computer system within which a set of instructions are executed, causing the machine to perform any one or more of the methods discussed herein, according to some embodiments.

FIG. 11 is a diagrammatic representation of the machine 1100 in the form of a computer system within which a set of instructions may be executed for causing the machine 1100 to perform any one or more of the methodologies discussed herein, according to some embodiments. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102. In some embodiments, the processors 1110 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute the instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiple cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable medium 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in some embodiments, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., the instructions 1116) for execution by a machine (e.g., the machine 1100), such that the instructions, when executed by one or more processors of the machine (e.g., the processors 1110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, the communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a USB).

In various embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling.

Furthermore, the machine-readable medium 1138 is non-transitory (in other words, not having any transitory signals) in that it does not embody a propagating signal. However, labeling the machine-readable medium 1138 "non-transitory" should not be construed to mean that the machine-readable medium 1138 is incapable of movement; the machine-readable medium 1138 should be considered as being transportable from one physical location to another. Additionally, since the machine-readable medium 1138 is tangible, the machine-readable medium 1138 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may he absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:
   accessing circuit data for a circuit design, the circuit design describing sets of wire instances and describing a first parameterized cell and a second parameterized cell for an individual set of wire instances of the circuit design, the first parameterized cell being configured to represent the individual set of wire instances, the second parameterized cell being configured to represent a cross-section of the individual set of wire instances based on cross-section information provided by the first parameterized cell;
   receiving, by a graphical user interface displayed on a client device, a user selection of the individual set of wire instances from the sets of wire instances;
   causing, on the graphical user interface, display of a top view of the individual set of wire instances and display of an elevation view of the individual set of wire instances, the top view including a first graphical representation of the individual set of wire instances, the elevation view including a second graphical representation of a cross section of the individual set of wire instances, the first graphical representation being generated based on the first parameterized cell, the second graphical representation being generated based on the second parameterized cell;
   receiving, by the graphical user interface, a set of user inputs for interacting with the cross section of the individual set of wire instances; and
   adjusting a set of parameters of the second parameterized cell based on the set of user inputs.

2. The non-transitory computer-readable medium of claim 1, wherein the operations comprising:
   after the adjusting, updating the cross-section information of the first parameterized cell based on the set of parameters of the second parameterized cell.

3. The non-transitory computer-readable medium of claim 2, wherein the cross-section information comprises a top view parameter modifiable by a field, wherein the set of parameters includes a fluid parameter modifiable by the graphical user interface, and wherein the updating of the cross-section information of the first parameterized cell based on the set of parameters of the second parameterized cell comprises:
   translating the fluid parameter to the top view parameter, the fluid parameter not being adjustable by the top view.

4. The non-transitory computer-readable medium of claim 1, wherein the operations comprising:
   generating the second parameterized cell based on the cross-section information.

5. The non-transitory computer-readable medium of claim 4, wherein the cross-section information comprises a top view parameter modifiable by a field, wherein the set of parameters includes a fluid parameter modifiable by the graphical user interface, and wherein the generating of the second parameterized cell based on the cross-section information comprises:
   translating the top view parameter to the fluid parameter, the fluid parameter not being adjustable by the top view.

6. The non-transitory computer-readable medium of claim 1, wherein the graphical user interface comprises a layer stack view, wherein the layer stack view includes a third graphical representation of an arrangement a set of physical elements available on different layers of the circuit design, and wherein the set of user inputs comprises dragging a graphical shape from the layer stack view to the second graphical representation of the cross section to add a new physical element to the individual set of wire instances.

7. The non-transitory computer-readable medium of claim 1, wherein the second graphical representation of the cross section comprises a set of graphical shapes that each represent a different physical element of the individual set of wire instances, and wherein the set of user inputs comprises stretching a graphical shape in the second graphical representation of the cross section.

8. The non-transitory computer-readable medium of claim 7, wherein the stretching of the graphical shape causes a modification of at least one of a position or width of an individual physical element of the individual set of wire instances represented by the graphical shape.

9. The non-transitory computer-readable medium of claim 8, wherein the stretching of the graphical shape comprises stretching the graphical shape along a horizontal axis.

10. The non-transitory computer-readable medium of claim 9, wherein the stretching of the graphical shape causes a modification of a position or a width of a physical element of the individual set of wire instances corresponding to the graphical shape.

11. The non-transitory computer-readable medium of claim 8, wherein the stretching of the graphical shape comprises stretching the graphical shape along a vertical axis.

12. The non-transitory computer-readable medium of claim 11, wherein the stretching of the graphical shape causes creation of a via between overlapping graphical shapes of the set of graphical shapes.

13. The non-transitory computer-readable medium of claim 1, wherein the elevation view comprises a graphical indication of a center line of the cross section of the individual set of wire instances.

14. The non-transitory computer-readable medium of claim 1, wherein the first parameterized cell is a transmission line parameterized cell associated with one or more wire instances of the circuit design, the one or more wire instances includes the individual set of wire instances, and the second parameterized cell is associated with the transmission line.

15. The non-transitory computer-readable medium of claim 1, wherein the set of parameters includes a fluid parameter, and wherein adjustment of the fluid parameter is limited to the elevation view.

16. A method comprising:
   accessing circuit data for a circuit design, the circuit data describing a first parameterized cell and a second parameterized cell for a set of wire instances of the circuit design, the first parameterized cell being configured to represent the set of wire instances, the second parameterized cell being configured to represent a cross-section of the set of wire instances based on cross-section information provided by the first parameterized cell;
   causing, on a graphical user interface displayed on a client device, display of a top view of the set of wire instances and display of an elevation view of the set of wire instances, the top view including a first graphical representation of the set of wire instances, the elevation view including a second graphical representation of a cross section of the set of wire instances, the first graphical representation being generated based on the first parameterized cell, the second graphical representation being generated based on the second parameterized cell;
   receiving, by the graphical user interface, a set of user inputs for interacting with the graphical representation of the cross section; and
   adjusting a set of parameters of the parameterized cell based on the set of user inputs.

17. The method of claim 16, comprising:
   after the adjusting, updating the cross-section information of the first parameterized cell based on the set of parameters of the second parameterized cell.

18. The method of claim 16, wherein the graphical user interface comprises a layer stack view, wherein the layer stack view includes a third graphical representation of an arrangement of different layers of the circuit design, and wherein the set of user inputs comprises dragging a graphical shape from the layer stack view to the second graphical representation of the cross section to add a new physical element to the set of wire instances.

19. The method of claim 16, wherein the second graphical representation of the cross section comprises a set of graphical shapes that each represent a different physical element of the set of wire instances, and wherein the set of user inputs comprises stretching a graphical shape in the second graphical representation of the cross section.

20. A device comprising:
   a memory storing instructions; and
   a hardware processor communicatively coupled to the memory and configured by the instructions to perform operations comprising:
      causing presentation of a graphical user interface on an electronic display;
      accessing circuit data for a circuit design, the circuit design describing a first parameterized cell and a second parameterized cell for a set of wire instances of the circuit design, the first parameterized cell being configured to represent the set of wire instances, the second parameterized cell being configured to represent a cross-section of the set of wire instances based on cross-section information provided by the first parameterized cell;
      causing, on the graphical user interface, display of a top view of the set of wire instances and display of an elevation view of the set of wire instances, the top view including a first graphical representation of the set of wire instances, the elevation view including a second graphical representation of a cross section of the set of wire instances, the first graphical representation being generated based on the first parameterized cell, the second graphical representation being generated based on the second parameterized cell;
      receiving, by the graphical user interface, a set of user inputs for interacting with the graphical representation of the cross section; and
      adjusting a set of parameters of the parameterized cell based on the set of user inputs.

* * * * *